United States Patent
Tan et al.

(10) Patent No.: US 8,749,225 B2
(45) Date of Patent: Jun. 10, 2014

(54) APPARATUS AND METHOD OF POWER MEASUREMENT FOR PULSED TERAHERTZ QUANTUM-CASCADE LASER

(75) Inventors: Zhiyong Tan, Shanghai (CN); Juncheng Cao, Shanghai (CN); Yingjun Han, Shanghai (CN); Zhen Chen, Shanghai (CN)

(73) Assignee: Shanghai Institute of Microsystem and Information Technology, Chinese Academy of Sciences, Shanghai (CN)

( * ) Notice: Subject to any disclaimer, the term of this patent is extended or adjusted under 35 U.S.C. 154(b) by 0 days.

(21) Appl. No.: 13/641,777

(22) PCT Filed: Aug. 29, 2011

(86) PCT No.: PCT/CN2011/079039
§ 371 (c)(1), (2), (4) Date: Oct. 17, 2012

(87) PCT Pub. No.: WO2012/162966
PCT Pub. Date: Dec. 6, 2012

(65) Prior Publication Data
US 2014/0103904 A1    Apr. 17, 2014

(30) Foreign Application Priority Data
May 30, 2011 (CN) .......................... 2011 1 0142266

(51) Int. Cl.
*G01R 13/38* (2006.01)

(52) U.S. Cl.
USPC .......................................................... 324/97

(58) Field of Classification Search
CPC ........... G01B 2290/25; G01B 2290/45; G01B 9/02002; G01R 15/241; G01R 15/245; G01R 19/10; G01R 31/308
USPC ........... 324/97, 762.01–762.1, 750.01–750.3; 356/480, 477
See application file for complete search history.

(56) References Cited

U.S. PATENT DOCUMENTS 5,684,778 A * 11/1997 Yamada et al. ................ 369/100
6,573,493 B1 * 6/2003 Futami et al. ................. 250/288

* cited by examiner

*Primary Examiner* — Tung X Nguyen
(74) *Attorney, Agent, or Firm* — Ming Chow; Sinorica, LLC

(57) ABSTRACT

The present invention provides a power measurement apparatus and method for a pulsed terahertz quantum-cascade laser (THz QCL). The apparatus includes a light source part, a light path part, and a detection part. Terahertz light emitted by a THz QCL reaches a terahertz quantum-well photodetector (THz QWP) through the measurement apparatus, and is absorbed to generate a corresponding current signal. A signal processing circuit extracts a voltage signal from the current signal, amplifies the voltage signal, and inputs the amplified voltage signal to an oscilloscope for reading and displaying. According to a responsivity of the THz QWP at a lasing frequency of the laser, the measurement of the output power of the pulsed THz QCL is acquired. The present invention avoids integration estimation when a thermal detector is used to measure output power of a THz QCL in a pulse operating mode, and can directly acquire the power value of a pulsed output from the laser according to the amplitude of the detector responding to the pulsed terahertz light.

13 Claims, 3 Drawing Sheets

APPARATUS AND METHOD OF POWER MEASUREMENT FOR PULSED TERAHERTZ QUANTUM-CASCADE LASER

BACKGROUND OF THE PRESENT INVENTION

1. Field of Invention

The present invention belongs to the field of terahertz technology, and relates to a power measurement apparatus and method for a pulsed terahertz quantum-cascade laser (THz QCL).

2. Description of Related Arts

The terahertz (THz, 1 THz=$10^{12}$ Hz) radiation is an electromagnetic wave region that is between the millimeter-wave and the infrared light, and covers the frequency range from 100 GHz to 10 THz. With the continuous innovation in the fields of photonics and nanotechnologies, the terahertz radiation is rapidly developed in the fields of information and communication technology, national security, biomedicine, non-destructive testing, quality control of food and agricultural products, and global environmental monitoring, and is considered to have great application prospects and values in these fields. In recent years, the terahertz field developed rapidly, and the THz QCL used as an important radiation source of the terahertz range is subject to extensive and in-depth research, which has achieved important progress. The THz QCL has features such as high energy conversion efficiency, fast response, small size, easy integration, and long life-time. Until now, the highest operating temperature of the THz QCL in a pulsed mode is 186 K, and in an optimal working condition, the highest output power of the device may reach 248 mW. Through structural improvement on an active region of the device, currently the operating temperature of the THz QCL in the pulse operating mode already reaches 1.9 $\hbar\omega/k_B$ ($\omega$ is a lasing frequency of the laser), and further structural improvement may be expected to enable the device to achieve room temperature lasing. In respect of the lasing frequency, currently the lowest operating frequency of the THz QCL is 1.2 THz, and can reach 0.68 THz under the support of a magnetic field. With the rapid development of the device performance, the application of the device attracts more and more attention. Currently, the THz QCLs have been successfully applied to terahertz technique such as local oscillation sources of heterodyne detection, terahertz wireless communications, and terahertz real-time imaging. The THz QCL in the pulse operating mode requires small cooling capacity and has single pulse peak power being far greater than an output power value of the device in a continuous wave mode, thereby being more competitive in applications of terahertz detection and imaging.

The output power is an important performance indicator for the device application, and the value of the output power directly determines the application field and applied range of the device. Therefore, how to measure the effective output power of the device accurately is a key step in the application process of the device. The repeated frequency of an output laser beam of a pulsed THz QCL is usually about 2 kHz (corresponding to 0.5 ms), but the time constant of a traditional thermal detector (such as Golay Cell) is usually about 20 ms, so that it is very difficult to use the traditional thermal detector to measure the power of the output laser beam of the pulsed THz QCL. Currently around the world, the output power of the pulsed THz QCL is measured mainly through a bolometer detector cooled by using the liquid helium. Integration is performed on a thermal response waveform generated by emitting a single terahertz pulse to the sensitive surface of the detector, so as to estimate energy of a single terahertz pulse, thereby acquiring peak power of the single terahertz pulse. A terahertz quantum-well photodetector (THz QWP) is a semiconductor detector well matching the operating frequency range of the THz QCL. The responsivity of the device to terahertz light in the detectable range may reach the order of magnitude of GHz (the order of magnitude of ns), so that when the THz QWP is used to measure the output power of the pulsed THz QCL, the integration process is not required, and the peak power of pulsed terahertz light output from the THz QCL may be acquired directly according to the amplitude of a response signal and the responsivity of the THz QWP at the lasing frequency of the THz QCL.

SUMMARY OF THE PRESENT INVENTION

The technical problems to be solved by the present invention are to provide a power measurement method for a pulsed THz QCL. The measurement method can visually acquire the peak power of a lasing pulse of a laser and avoid the step in the conventional method which estimates the peak power of a lased pulse through integral calculation.

Furthermore, the present invention further provides a power measurement apparatus for a pulsed THz QCL.

In order to solve the technical problems, the present invention adopts the following technical solutions.

A power measurement apparatus for a pulsed THz QCL comprises a light source part, a light path part and a detection part.

The light source part comprises a first cold head, a first heat sink mounted in the first cold head, a THz QCL mounted on the first heat sink, a pulse power supply connected to the THz QCL, and a first polyethylene window mounted on the first cold head; terahertz light emitted by the THz QCL is emitted to the outside through the first polyethylene window.

The light path part comprises a first off-axis parabolic mirror and a second off-axis parabolic mirror; the first off-axis parabolic mirror collects the terahertz light emitted to the outside through the first polyethylene window, and reflects the terahertz light to the second off-axis parabolic mirror; the second off-axis parabolic mirror receives the terahertz light reflected by the first off-axis parabolic mirror, and reflects the terahertz light to the detection part.

The detection part comprises a second cold head, a second polyethylene window mounted on the second cold head, a second heat sink mounted in the second cold head, a THz QWP mounted on the second heat sink, a signal processing circuit connected to the THz QWP, and an oscilloscope connected to the signal processing circuit; the second polyethylene window enables the terahertz light reflected by the second off-axis parabolic mirror to enter the second cold head and reach the sensitive surface of the THz QWP; the THz QWP is used to receive the terahertz light reflected by the second off-axis parabolic mirror, and generate a corresponding current signal; the signal processing circuit extracts a voltage signal from the current signal, and amplifies the voltage signal; the oscilloscope is used to read and display the voltage signal amplified by the signal processing circuit, so as to acquire the amplitude of the voltage signal.

According to a preferred solution of the present invention, the THz QWP is a photoconductive low-dimensional semiconductor detector, and an active region thereof is formed by alternately growing a GaAs layer and an AlGaAs layer on a semi-insulating GaAs substrate.

According to a preferred solution of the present invention, the active region of the THz QWP comprises 23 repeats, and each repeat comprises one GaAs layer and one $Al_{0.015}Ga_{0.985}As$ layer that grow alternately.

According to another preferred solution of the present invention, the THz QWP has a peak detection frequency being 3.2 THz and a main detection frequency range being 3.0-5.3 THz; the main detection frequency range refers to a frequency range with the response amplitude ≥40% of the peak response amplitude.

According to another preferred solution of the present invention, a lasing frequency range of the THz QCL is 4.02-4.13 THz.

According to another preferred solution of the present invention, the active region of the THz QCL is formed by alternately growing a GaAs layer and an AlGaAs layer on a semi-insulating GaAs substrate.

According to another preferred solution of the present invention, the active region of the THz QWP is of a four-well resonant phonon structure, and comprises 178 repeats, and each repeat comprises four GaAs layers and four $Al_{0.15}Ga_{0.85}As$ layers that grow alternately.

According to another preferred solution of the present invention, the first polyethylene window and the second polyethylene window are both made of a high-density polyethylene (HDPE) material.

According to another preferred solution of the present invention, the first polyethylene window and the second polyethylene window are both made by performing cutting, abrading and polishing on a cast HDPE cylindrical material.

According to another preferred solution of the present invention, reflective surfaces of the first off-axis parabolic mirror and the second off-axis parabolic mirror are both a gold coated off-axis parabolic surface.

According to another preferred solution of the present invention, the pulse power supply is programmable, and comprises two power supply modes, namely, positive bias and negative bias; the pulse power supply has an output current range being 0-5 A, a pulse width modulation range being 50 ns-5 μs, an output pulse repetition frequency range being 1-10 kHz, and a pulse maximum duty cycle being 1%.

According to another preferred solution of the present invention, the signal processing circuit comprises a voltage amplifier, a power supply battery, a voltage dividing resistor, and several circuit connection cables; the power supply battery, the voltage dividing resistor, and the THz QWP are connected in series to form a closed loop; the voltage amplifier is used to extract voltages at two ends of the voltage dividing resistor.

According to another preferred solution of the present invention, the oscilloscope is a digital oscilloscope, and comprises 4 channels capable of measuring; the oscilloscope has a measurement bandwidth being 500 MHz, a sampling rate being 4 Gsa/s, and a storage depth of 8 Mpts.

A power measurement method for a pulsed THz QCL based on the power measurement apparatus includes the following steps.

In Step 1, the pulse power supply is used to apply a periodic pulse drive voltage to a THz QCL, so that the THz QCL radiates periodic pulsed terahertz light, the periodic pulsed terahertz light reaches the first off-axis parabolic mirror after passing through the first polyethylene window.

In Step 2, the first off-axis parabolic mirror receives the periodic pulsed terahertz light emitted through the first polyethylene window, and reflects the periodic pulsed terahertz light to the second off-axis parabolic mirror; the second off-axis parabolic mirror receives the periodic pulsed terahertz light reflected by the first off-axis parabolic mirror, and reflects the periodic pulsed terahertz light to the detection part; the periodic pulsed terahertz light reflected by the second off-axis parabolic mirror reaches the sensitive surface of the THz QWP on the second heat sink after passing through the second polyethylene window of the detection part.

In Step 3, after responding to the incident periodic pulsed terahertz light, the THz QWP of the detection part generates a corresponding periodic pulse current signal; the signal processing circuit is used to extract a voltage signal from the current signal, amplify the voltage signal, and input the amplified voltage signal into the oscilloscope; the oscilloscope reads and displays the voltage signal, the amplitude of the voltage signal is acquired, and the amplitude of the voltage signal reflects the magnitude of the response of the THz QWP with respect to the terahertz light.

In Step 4, according to the amplitude of the voltage signal displayed in the oscilloscope and the response rate of the THz QWP at the lasing frequency of the THz QCL, the power of the terahertz light reaching the sensitive surface of the THz QWP is calculated, and then the power of the terahertz light radiated by the THz QCL to the outside through the first polyethylene window is calculated according to collection efficiency of the whole measurement apparatus.

Beneficial effects of the present invention are as follows.

(1) In the present invention, a THz QWP having the operating frequency range matching the lasing frequency range of the THz QCL is used as a receiver, so that the detection results with respect to the pulsed terahertz light are very desirable.

(2) The THz QWP is quick in response with respect to the terahertz light, a pulse terahertz light signal may be well converted into a corresponding pulse electrical signal, and the signal processing circuit and the oscilloscope may be used to acquire the amplitude of the pulse electrical signal, so as to visually acquire the peak power of a lased pulse of a laser, thereby avoiding the integration estimation process adopted by the conventional method.

(3) The power measurement apparatus for the pulsed THz QCL according to the present invention has desirable reflection (or transmission) characteristics, so as to enable the measurement apparatus to reach as high as possible collection efficiency with respect to the terahertz light.

DETAILED DESCRIPTION OF THE PREFERRED EMBODIMENTS

Embodiments of the present invention are further illustrated below in detail with reference to the accompanying drawings.

The present invention provides an apparatus for measuring the power of an output laser beam of a pulsed THz QCL and a power measurement method thereof, which includes: a light source part (a pulse power supply, a first cold head, a first heat sink mounted in the first cold head, a THz QCL mounted on the first heat sink, and a first polyethylene window mounted on the first cold head), a light path part (two off-axis parabolic mirrors and the atmosphere), and a detection part (a second cold head, a second polyethylene window mounted on the second cold head, a second heat sink mounted in the second cold head, a THz QWP mounted on the second heat sink, a signal processing circuit and an oscilloscope). The present invention has the following advantages. A THz QWP, which is quick in response, and has the operating frequency range matching the lasing frequency range of the THz QCL, is used as a receiver, so as to convert a pulsed terahertz light signal into a corresponding pulse electrical signal, and acquire the amplitude of the pulse electrical signal through a signal processing circuit and an oscilloscope, thereby visually acquiring the peak power of a lasing pulse of the THz QCL and avoiding the integration estimation process adopted in the conventional method.

Embodiment 1

Figure 1:
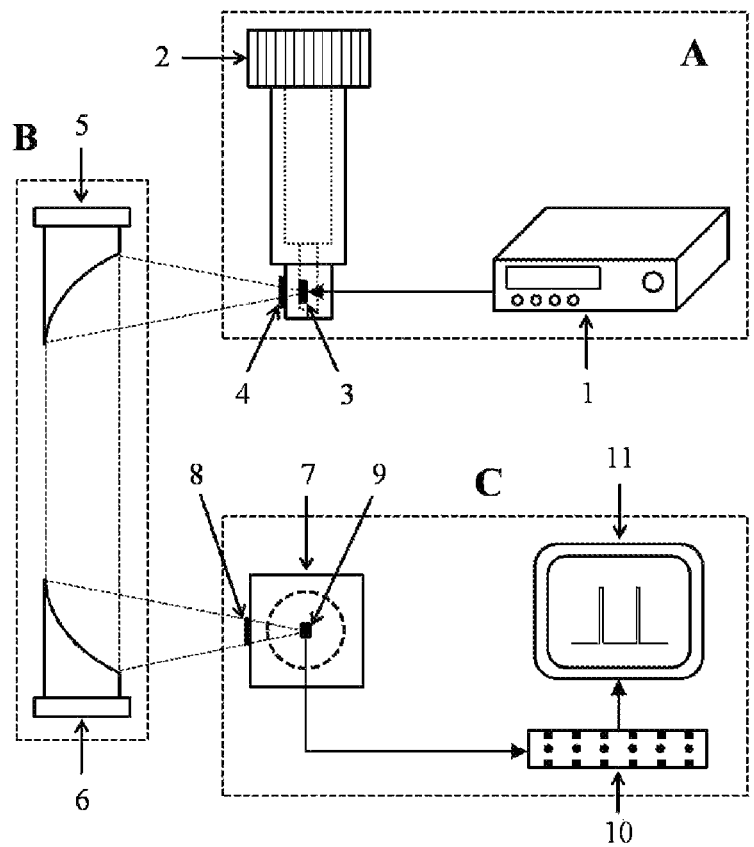
FIG. 1 is a schematic of a power measurement apparatus for a pulsed THz QCL according to the present invention.

This embodiment provides a power measurement apparatus for a pulsed THz QCL, as shown in FIG. 1.

The apparatus includes a light source part A, a light path part B, and a detection part C.

Light Source Part A

The light source part A includes: a pulse power supply 1, a first cold head 2, a first heat sink 3 mounted in the first cold head 2, a THz QCL mounted on the first heat sink 3, and a first polyethylene window 4. The first polyethylene window 4 is mounted on the first cold head 2, so that terahertz light emitted by the THz QCL is emitted to the outside through the first polyethylene window 4.

Figure 2:
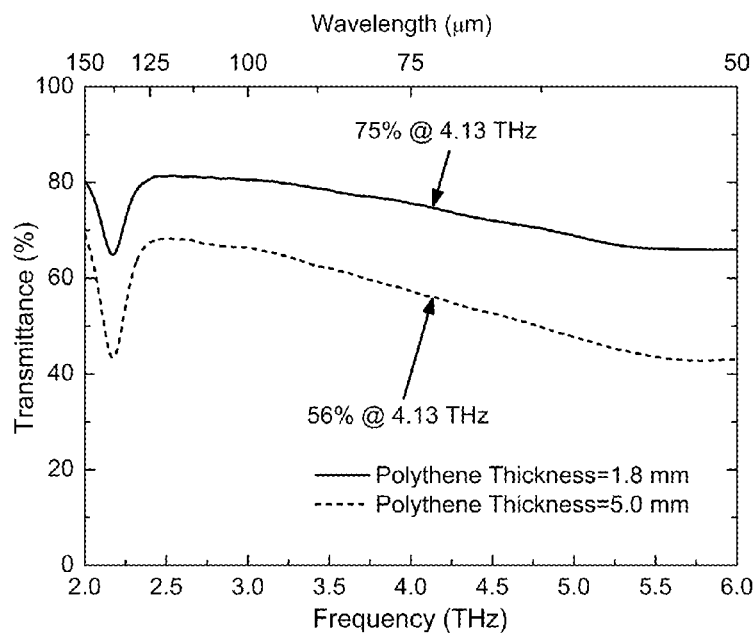
FIG. 2 illustrates the transmittance spectra of two polyethylene windows being 1.8 mm and 5.0 mm thick respectively in the 2.0-6.0 THz frequency range.

The pulse power supply 1 is programmable, and includes two power supply modes, namely, positive bias and negative bias. The pulse power supply 1 has an output current range being 0-5 A, a pulse width modulation range being 50 ns-5 an output pulse repetition frequency range being 1-10 kHz, and a pulse maximum duty cycle being 1%. The first heat sink 3 is made of a copper material, and is often used as a thermal conductor of a micro device in the field of cryogenic technologies. An active region of the THz QCL is of a "four-well resonant phonon" structure, and is formed by alternately growing the GaAs layer and the $Al_{0.15}Ga_{0.85}As$ layer on a semi-insulating GaAs substrate through a molecular beam epitaxy method. The active region totally has 178 repeats, and each repeat includes four GaAs layers and four $Al_{0.15}Ga_{0.85}As$ layers that grow alternately. The size of the device is 1 mm×40 μm (length×width). The lasing frequency range is 4.02-4.13 THz. In this embodiment, the lasing frequency of the laser is preferably 4.13 THz, and the operation temperature of the device is 10 K. The first cold head 2 for providing a low-temperature environment is a part of a closed loop mechanical cooling system, and the lowest temperature thereof may reach 9 K. The first polyethylene window 4 is made of an HDPE material. The window is made by performing cutting, abrading and polishing on a cast HDPE cylindrical material. The window has the diameter being 60 mm, the thickness being 5.0 mm, and a transmittance being 56% with respect to the 4.13 THz electromagnetic wave, as shown in FIG. 2.

Light Path Part B

The light path part B includes a first off-axis parabolic mirror 5, a second off-axis parabolic mirror 6, and the atmosphere through which the terahertz light passes. The first off-axis parabolic mirror 5 receives the terahertz light emitted to the outside through the first polyethylene window 4, and reflects the terahertz light to the second off-axis parabolic mirror 6. The second off-axis parabolic mirror 6 receives the terahertz light reflected by the first off-axis parabolic mirror 5, and reflects the terahertz light to the detection part C.

Figure 3:
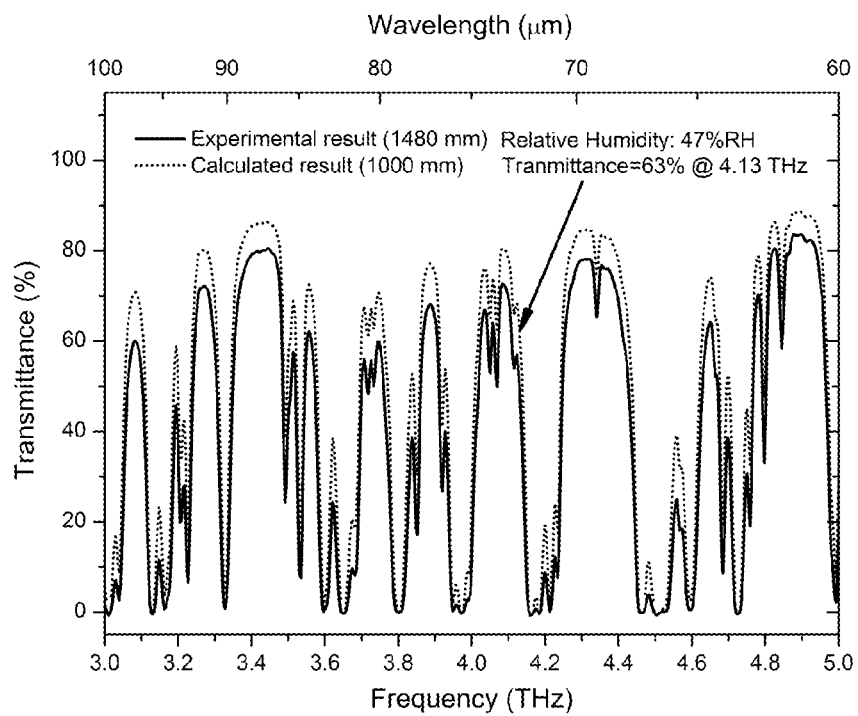
FIG. 3 illustrates the experimental and calculated transmittance spectra of the atmosphere in the 3.0-5.0 THz frequency range.

The first off-axis parabolic mirror 5 and the second off-axis parabolic mirror 6 both have a focal length being 101.6 mm, a reflective surface being a gold coated off-axis parabolic surface, and the reflectivity being 98% with respect to the 4.13 THz electromagnetic wave. The distance of the atmosphere through which the terahertz light passes is 1000 mm. According to a measurement result of the transmittance (T) of the atmosphere with relative humidity being the same (RH47%), and the relationship between the transmittance and medium thickness (L) ($T \propto e^{-\alpha L}$, $\alpha$ is an absorption coefficient), the calculated transmittance of the 1000 mm thick atmosphere with respect to the 4.13 THz electromagnetic wave is 63%, as shown in FIG. 3.

Detection Part C

The detection part C includes: a second cold head 7, a second polyethylene window 8 mounted on the second cold head 7, a second heat sink 9 mounted in the second cold head 7, a THz QWP mounted on the second heat sink 9, a signal processing circuit 10, and an oscilloscope 11. The terahertz light reflected by the second off-axis parabolic mirror 6 converges on the sensitive surface of the THz QWP on the second heat sink 9 after passing through the second polyethylene window 8. After fast response to the terahertz light, the THz QWP generates a corresponding current signal. The signal processing circuit 10 extracts a voltage signal from the current signal, amplifies the voltage signal, and then inputs the amplified voltage signal to the oscilloscope 11. The oscilloscope 11 reads and displays the voltage signal, so as to acquire the amplitude of the voltage signal. The amplitude of the voltage signal reflects the magnitude of the response of the THz QWP to the terahertz light.

Figure 4:
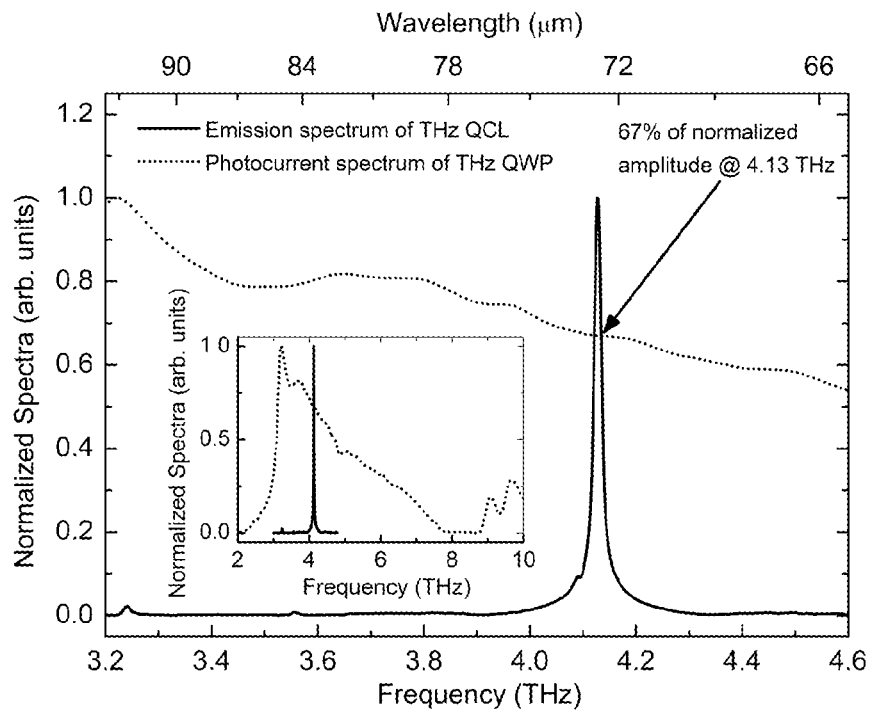
FIG. 4 is the comparison diagram between the light response spectrum of a THz QWP and the emission spectrum of a THz QCL.

The second heat sink 9 is made of a copper material, and is often used as a thermal conductor of a micro device in the field of cryogenic technologies. The THz QWP is a photoconductive low-dimensional semiconductor detector, and the active region thereof is formed by alternately growing the GaAs layer and the $Al_{0.015}Ga_{0.985}As$ layer on a semi-insulating GaAs substrate through a molecular beam epitaxy method. The active region totally has 23 repeats, and each repeat includes one GaAs layer and one $Al_{0.015}Ga_{0.985}As$ layer that grow alternately. The size of the device is 800 μm×800 μm (length×width). The device has a peak detection frequency being 3.2 THz, the main detection frequency range (the response amplitude ≥40% of the peak response amplitude) being 3.0-5.3 THz, and the response amplitude at 4.13 THz being 67% of the peak response amplitude (FIG. 4). The operating temperature of the device is 4.2 K, and an externally applied bias voltage is −48 mV. The second cold head 7 for providing a low-temperature environment is a part of a closed loop mechanical cooling system, and the lowest temperature thereof may reach 3 K. The second polyethylene window 8 is made of an HDPE material. The window is made by performing cutting, abrading and polishing on a cast HDPE cylindrical material. The window has the diameter being 35 mm, the thickness being 1.8 mm, and a transmittance being 75% with respect to the 4.13 THz electromagnetic wave, as shown in FIG. 2. The signal processing circuit 10 includes a voltage amplifier, a power supply battery, a voltage dividing resistor, and several circuit connection cables. The power supply battery, the voltage dividing resistor, and the THz QWP are connected in series to form a closed loop. The voltage amplifier is used to extract voltages at two ends of the voltage dividing resistor. The coupling of the voltage amplifier is direct current (DC) coupling. The amplification factor is 2. The power supply battery is a size #5 dry battery. The resistance value of the voltage dividing resistor is 5 MΩ. The oscilloscope 11 is a digital oscilloscope, and mainly has the following parameters: 4 channels capable of measuring, a 500 MHz measurement bandwidth, a sampling rate of 4 Gsa/s, and a standard storage depth of 8 Mpts.

The apparatus is used for the measurement of the output power of the pulsed terahertz frequency band laser, specifically, the measurement of the output power of a THz QCL. In the measurement apparatus, the THz QWP having fast response to the terahertz light is used as the detection apparatus, the polyethylene material absorbing less terahertz light is used as the window, and the off-axis parabolic mirrors having high reflectivity with respect to the terahertz light is used as the apparatus for collecting and reflecting the terahertz light.

Embodiment 2

This embodiment describes a measurement method for the measurement apparatus according to Embodiment 1, which includes the following steps.

In Step 1, after a pulse power supply is used to apply a voltage pulse signal, with the amplitude being 12.4 V, the period being 500 μs (the corresponding repetition frequency being 2 kHz) and the pulse width being 5 μs, to the THz QCL mounted on the first heat sink of the light source part (referring to FIG. 5, in order to enhance the comparison effect, the drive signal of the laser in the drawing is normalized), the THz QCL radiates pulsed terahertz light with the period being 500 μs (the corresponding repetition frequency being 2 kHz) and the pulse width being 5 μs (the laser beam frequency is 4.13 THz), and the pulsed terahertz light reaches the first off-axis parabolic mirror after passing through the first polyethylene window.

In Step 2, the first off-axis parabolic mirror receives the pulsed terahertz light emitted through the first polyethylene window, and reflects the pulsed terahertz light to the second off-axis parabolic mirror; the second off-axis parabolic mirror receives the pulsed terahertz light reflected by the first off-axis parabolic mirror, and reflects the pulsed terahertz light to the detection part; the pulsed terahertz light reflected by the second off-axis parabolic mirror reaches the sensitive surface of the THz QWP on the second heat sink of the detection part after passing through the second polyethylene window.

Figure 5:
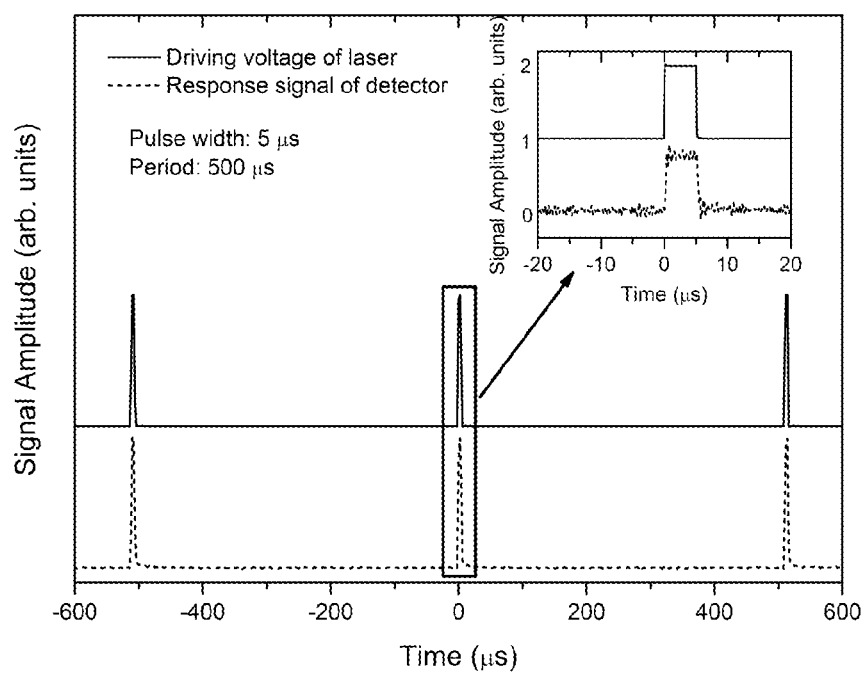
FIG. 5 is a comparison diagram of the waveform, acquired through an oscilloscope, of a pulsed bias signal externally applied to a THz QCL and the waveform of response signal of a THz QWP with respect to pulsed terahertz light, where the inset shows a partially enlarged view of the part covered by the block.

In Step 3, after fast response to the pulsed terahertz light reflected by the second off-axis parabolic mirror, the THz QWP in the detection part generates a corresponding pulse current signal; the signal processing circuit is used to extract out a pulse voltage signal (the period being 500 μs, and the pulse width being 5 μs) from the pulse current signal, amplify the pulse voltage signal, and input the amplified pulse voltage signal into the oscilloscope for reading and displaying, And the display result is shown in FIG. 5 (in order to enhance the comparison effect, the response signal of the detector in the drawing is normalized); after the oscilloscope reads and displays the pulse voltage signal, the amplitude of the pulse voltage signal may be acquired, and the amplitude of the pulse voltage signal reflects the magnitude of the response of the THz QWP with respect to the pulsed terahertz light.

In Step 4, according to the amplitude of the pulse voltage signal displayed in the oscilloscope and the responsivity of the THz QWP at the lasing frequency of the THz QCL, the power of the pulsed terahertz light reaching the sensitive surface of the THz QWP is calculated, and then the power of the pulsed terahertz light radiated by the THz QCL to the outside through the first polyethylene window is calculated according to collection efficiency of the whole measurement apparatus.

The responsivity of the THz QWP is calibrated by using a standard blackbody radiation source. When the standard blackbody radiation source irradiates the sensitive surface of the THz QWP, the detector generates a photocurrent, which causes the resistance thereof to change. The voltages applied to the two ends of the detector and the voltage dividing resistor are fixed, so that in this case, the voltages at the two ends of the voltage dividing resistor change, and according to voltage change values at the two ends of the voltage dividing resistor and the serial relationship between the voltage dividing resistor and the THz QWP, the photocurrent generated by the detector under the irradiation of the standard blackbody radiation source may be accurately calculated. According to the output power of the standard blackbody radiation source and a photocurrent spectrum of the detector, the responsivity of the detector with respect to different frequencies within the detectable frequency range thereof may be calculated, thereby completing the calibration of the responsivity of the THz QWP. The collection efficiency of the whole measurement apparatus is the transmittance of the terahertz light at the lasing frequency of the THz QCL with respect to the transmission in the whole measurement apparatus, that is, the product of the transmittance of the first polyethylene window with respect to the terahertz light, the transmittance of the second polyethylene window with respect to the terahertz light, the collection efficiency of the first off-axis parabolic mirror with respect to the terahertz light emitted at the first polyethylene window, the reflection efficiency of the first off-axis parabolic mirror and the second off-axis parabolic mirror with respect to the terahertz light, and the transmittance of the atmosphere along the whole light path with respect to the terahertz light.

Embodiment 3

This embodiment detects the collection efficiency of the measurement apparatus according to Embodiment 1, and contents to be detected include five parts.

(1) The transmittance of the first polyethylene window of the first cold head with respect to the 4.13 THz light.

(2) The transmittance of the second polyethylene window of the second cold head with respect to the 4.13 THz light.

(3) The collection efficiency of the first off-axis parabolic mirror with respect to the terahertz light emitted at the first polyethylene window.

(4) The reflection efficiency of the first off-axis parabolic mirror and the second off-axis parabolic mirror with respect to the 4.13 THz light.

(5) The transmittance of the atmosphere along the whole light path with respect to the 4.13 THz light.

By using the collection efficiency of the 4.13 THz light as an example, an acquired experimental measurement result is as follows.

(1) The transmittance of the first polyethylene window mounted on the first cold head is 56%.

(2) The transmittance of the second polyethylene window mounted on the second cold head is 75%.

(3) The collection efficiency of the first off-axis parabolic mirror with respect to the 4.13 THz light is 10%.

(4) The combined reflectivity of the two off-axis parabolic mirrors with respect to the 4.13 THz light is 96%.

(5) The transmittance of the whole light path part (the distance being 1000 mm) with respect to the 4.13 THz light is 63%.

Therefore, the collection efficiency of the whole measurement apparatus with respect to the 4.13 THz light is 2.54%.

Furthermore, this embodiment further provides a calculation method of the output power of the pulsed THz QCL, and main contents of the method are as follows.

First, according to the amplitude of the voltage signal displayed in the oscilloscope and corresponding to the response signal of the THz QWP, and the responsivity of the detector at the lasing frequency of the laser, the optical power value of the pulsed terahertz light on the sensitive surface of the THz QWP is calculated.

Then, according to the collection efficiency of the whole measurement apparatus with respect to the terahertz light, the optical power of the pulsed terahertz light emitted by the pulsed THz QCL to the outside through the first polyethylene window of the first cold head is calculated, thereby acquiring the output power of the pulsed THz QCL.

The description and application of the present invention here are merely for exemplary purpose, and are not intended to limit the scope of the present to the above embodiments. The variations and modifications of the embodiments disclosed herein are possible, and for persons with ordinary skill in the art, the replacement and various equivalent parts in the present invention are publicly known. It should be understood by persons skilled in the art that, the present invention may be implemented through other forms, structures, arrangements, proportions and other components, materials and parts without departing from the spirit and essential features of the present invention.

What is claimed is:

1. A power measurement apparatus for a pulsed terahertz quantum-cascade laser (THz QCL), comprising: a light source part (A), a light path part (B) and a detection part (C), wherein
    the light source part (A) comprises a first cold head (2), a first heat sink (3) mounted in the first cold head (2), a THz QCL mounted on the first heat sink (3), a pulse power supply (1) connected to the THz QCL, and a first polyethylene window (4) mounted on the first cold head; terahertz light emitted by the THz QCL is emitted to the outside through the first polyethylene window (4);
    the light path part (B) comprises a first off-axis parabolic mirror (5) and a second off-axis parabolic mirror (6); the first off-axis parabolic mirror (5) collects the terahertz light emitted to the outside through the first polyethylene window (4), and reflects the terahertz light to the second off-axis parabolic mirror (6); the second off-axis parabolic mirror (6) receives the terahertz light reflected by the first off-axis parabolic mirror (5), and reflects the terahertz light to the detection part (C); and
    the detection part (C) comprises a second cold head (7), a second polyethylene window (8) mounted on the second cold head (7), a second heat sink (9) mounted in the second cold head (7), a terahertz quantum-well photodetector (THz QWP) mounted on the second heat sink (9), a signal processing circuit (10) connected to the THz QWP, and an oscilloscope (11) connected to the signal processing circuit (10); the second polyethylene window (8) enables the terahertz light reflected by the second off-axis parabolic mirror (6) to enter the second cold head (7) and reach the sensitive surface of the THz QWP; the THz QWP is used to receive the terahertz light reflected by the second off-axis parabolic mirror (6), and generate a corresponding current signal; the signal processing circuit (10) extracts out a voltage signal from the current signal, and amplifies the voltage signal; the oscilloscope (11) is used to read and display the voltage signal amplified by the signal processing circuit (10), so as to acquire the amplitude of the voltage signal.

2. The power measurement apparatus for a pulsed THz QCL as in claim 1, wherein: a lasing frequency range of the THz QCL is 4.02-4.13 THz; the THz QWP has a peak detection frequency being 3.2 THz and a main detection frequency range being 3.0-5.3 THz; the main detection frequency range refers to a frequency range with the response amplitude ≥40% of the peak response amplitude.

3. The power measurement apparatus for a pulsed THz QCL as in claim 2, wherein: the THz QWP is a photoconductive low-dimensional semiconductor detector, and an active region thereof is formed by alternately growing a GaAs layer and an AlGaAs layer on a semi-insulating GaAs substrate.

4. The power measurement apparatus for a pulsed THz QCL as in claim 3, wherein: the active region of the THz QWP comprises 23 repeats, and each repeat comprises one GaAs layer and one $Al_{0.015}Ga_{0.985}As$ layer that grow alternately.

5. The power measurement apparatus for a pulsed THz QCL as in claim 2, wherein: the active region of the THz QCL is formed by alternately growing a GaAs layer and an AlGaAs layer on a semi-insulating GaAs substrate.

6. The power measurement apparatus for a pulsed THz QCL as in claim 5, wherein: the active region of the THz QWP is of a four-well resonant phonon structure, and comprises 178 repeats, and each repeat comprises four GaAs layers and four $Al_{0.15}Ga_{0.85}As$ layers that grow alternately.

7. The power measurement apparatus for a pulsed THz QCL as in claim 1, wherein: the first polyethylene window (4) and the second polyethylene window (8) are both made of a high-density polyethylene (HDPE) material.

8. The power measurement apparatus for a pulsed THz QCL as in claim 7, wherein: the first polyethylene window (4) and the second polyethylene window (8) are both made by performing cutting, abrading and polishing on a cast HDPE cylindrical material.

9. The power measurement apparatus for a pulsed THz QCL as in claim 1, wherein: reflective surfaces of the first off-axis parabolic mirror (5) and the second off-axis parabolic mirror (6) are both a gold coated off-axis parabolic surface.

10. The power measurement apparatus for a pulsed THz QCL as in claim 1, wherein: the pulse power supply (1) is programmable, and comprises two power supply modes, namely, positive bias and negative bias; the pulse power supply (1) has an output current range being 0-5 A, a pulse width modulation range being 50 ns-5 μs, an output pulse repetition frequency range being 1-10 kHz, and a pulse maximum duty cycle being 1%.

11. The power measurement apparatus for a pulsed THz QCL as in claim 1, wherein: the signal processing circuit (10) comprises a voltage amplifier, a power supply battery, a voltage dividing resistor, and several circuit connection cables; the power supply battery, the voltage dividing resistor, and the THz QWP are connected in series to form a closed loop; the voltage amplifier is used to extract voltages at two ends of the voltage dividing resistor.

12. The power measurement apparatus for a pulsed THz QCL as in claim 1, wherein: the oscilloscope (11) is a digital oscilloscope, and comprises 4 channels capable of measuring; the oscilloscope (11) has a measurement bandwidth being 500 MHz, a sampling rate being 4 Gsa/s, and a storage depth of 8 Mpts.

13. A power measurement method for a pulsed terahertz quantum-cascade laser (THz QCL), comprising the following steps:
    in Step 1, a pulse power supply (1) is used to apply a periodic pulse drive voltage to a THz QCL, so that the THz QCL radiates periodic pulsed terahertz light;

the periodic pulsed terahertz light reaches a first off-axis parabolic mirror (5) after passing through a first polyethylene window (4);

in Step 2, the first off-axis parabolic mirror (5) receives the periodic pulsed terahertz light emitted through the first polyethylene window (4), and reflects the periodic pulsed terahertz light to a second off-axis parabolic mirror (6); the second off-axis parabolic mirror (6) receives the periodic pulsed terahertz light reflected by the first off-axis parabolic mirror (5), and reflects the periodic pulsed terahertz light to a detection part (C); the periodic pulsed terahertz light reflected by the second off-axis parabolic mirror (6) reaches the sensitive surface of a terahertz quantum-well photodetector (THz QWP) on a second heat sink (9) after passing through a second polyethylene window (8) of the detection part (C);

in Step 3, after responding to the incident periodic pulsed terahertz light, the THz QWP of the detection part (C) generates a corresponding periodic pulse current signal; the signal processing circuit (10) is used to extract a voltage signal from the current signal, amplify the voltage signal, and input the amplified voltage signal into an oscilloscope (11); the oscilloscope (11) reads and displays the voltage signal, the amplitude of the voltage signal is acquired, and the amplitude of the voltage signal reflects the magnitude of the response of the THz QWP with respect to the terahertz light; and in Step 4, according to the amplitude of the voltage signal displayed in the oscilloscope (11) and the responsivity of the THz QWP at the lasing frequency of the THz QCL, the power of the terahertz light reaching the sensitive surface of the THz QWP is calculated, and then the power of the terahertz light radiated by the THz QCL to the outside through the first polyethylene window (4) is calculated according to collection efficiency of the whole measurement apparatus.

* * * * *